(12) United States Patent
Tinnemeyer

(10) Patent No.: US 7,019,542 B2
(45) Date of Patent: Mar. 28, 2006

(54) METHOD AND APPARATUS FOR BATTERY TESTING

(75) Inventor: Joern A. Tinnemeyer, Richmond (CA)

(73) Assignee: Cadex Electronics Inc., Richmond (CA)

(*) Notice: Subject to any disclaimer, the term of this patent is extended or adjusted under 35 U.S.C. 154(b) by 2 days.

(21) Appl. No.: 10/817,858

(22) Filed: Apr. 6, 2004

(65) Prior Publication Data

US 2005/0218915 A1    Oct. 6, 2005

(51) Int. Cl.
  *G01R 27/08*  (2006.01)
  *G01N 27/416*  (2006.01)

(52) U.S. Cl. ............................ 324/709; 324/426

(58) Field of Classification Search .......... 324/709, 324/691, 649, 600, 379, 521, 425–428, 430–434, 324/602, 603–608, 617, 622, 76.52, 683, 324/76.77, 158.1; 702/30–32, 70–72, 57, 702/66, 67; 320/130, 132, 162, 164, 141
See application file for complete search history.

(56) References Cited

U.S. PATENT DOCUMENTS

| | | | | |
|---|---|---|---|---|
| 5,182,518 | A * | 1/1993 | Stich et al. ............... | 324/511 |
| 5,661,393 | A * | 8/1997 | Sengupta ................... | 320/146 |
| 5,883,497 | A * | 3/1999 | Turnbull .................... | 320/132 |
| 6,037,777 | A * | 3/2000 | Champlin .................. | 324/430 |
| 6,307,378 | B1 * | 10/2001 | Kozlowski ................. | 324/430 |
| 6,411,098 | B1 * | 6/2002 | Laletin ....................... | 324/436 |
| 6,737,831 | B1 * | 5/2004 | Champlin .................. | 320/132 |
| 6,778,913 | B1 * | 8/2004 | Tinnemeyer ............... | 702/30 |
| 2003/0184307 | A1 * | 10/2003 | Kozlowski et al. ......... | 324/427 |
| 2003/0206021 | A1 * | 11/2003 | Laletin et al. .............. | 324/426 |

OTHER PUBLICATIONS

Huet, F., *A review of impedance measruements for determination of the state of charge or state of health of secondary batteries*, Journal of Power Sources 70 (1998), 56-69.

Noworolski, Z. et al., *Can a battery ohmic tester distinguish a good cell from a pool of better ones?*, Telecommunications Energy Conference 2002.

Feder, D.O., *Performance measurements and reliability of VRLA batteries*, Proceedings of the 1995 INTELEC Conference.

* cited by examiner

*Primary Examiner*—Anjan Deb
*Assistant Examiner*—Hoai-An D. Nguyen
(74) *Attorney, Agent, or Firm*—Oyen Wiggs Green & Mutala LLP

(57) ABSTRACT

A method for testing electrochemical cells applies to a portion of a cycle of a low-frequency excitation waveform to a cell under test while maintaining an amplitude of the excitation waveform below a threshold value. In some cases a quarter cycle of the excitation waveform is used. Phase an amplitude of a response to the excitation waveform may be determined by applying formulae based on geometry.

21 Claims, 9 Drawing Sheets

METHOD AND APPARATUS FOR BATTERY TESTING

TECHNICAL FIELD

The invention relates to testing electrochemical batteries. The invention relates more specifically to methods and apparatus for testing electrochemical storage batteries by electrochemical impedance spectrum analysis.

BACKGROUND

There is a need for rapid and accurate ways to test the state of health ("SoH") of electrochemical storage batteries. Consider, for example, the situation experienced by a company who uses a large number of two-way radios, cellular telephones, or other devices powered by rechargeable electrochemical batteries. The batteries in such devices degrade as they age. It is generally not viable to wait to replace each battery until it fails completely. This would interfere with the overall reliability of the equipment powered by the batteries. On the other hand, replacing batteries prematurely represents a significant unwarranted cost. It is therefore desirable to monitor the SoH of batteries so that the batteries can be replaced at an appropriate point well before complete failure. According to the IEEE 450 standard, which applies to vented lead-acid batteries used for standby operation, a battery should be replaced when it has degraded to the point that its capacity is 80% of the capacity that the battery had when new. Other standards and guidelines recommend replacement schedules for batteries of other types.

Electrochemical impedance spectrum analysis methods may be used to test electrochemical batteries. Such methods excite a battery under test with waveforms having various frequencies and monitor a response of the battery to the excitation waveforms. Information about the condition of the battery can be derived from relationships between the exciting waveform(s) and the response(s).

Huet F., *A review of impedance measurements for determination of the state of charge or state of health of secondary batteries*, Journal of Power Sources 70(1998), 56–69 discloses that the response of a battery to a single exciting waveform having a frequency in the range of 83–90 Hz can be used to assess the state of health ("SoH") of a battery. Various investigators have determined that such methods do provide reasonably reliable estimates of battery capacity for batteries which have capacities in the range of 1% to 75% of their nominal values. Such methods have been found to be unreliable for measuring capacities of 80% or more (Noworolski, Z. et al., *Can a battery ohmic tester distinguish a good cell from a pool of better ones?*, Telecommunications Energy Conference 2002; and, Feder, D. O., *Performance measurements and reliability of VRLA batteries*, Proceedings of the 1995 INTELEC Conference).

It can be seen that current testing methods have serious problems because such methods are least accurate in the range above 80% capacity, which is the same range in which the greatest accuracy is desired. Ideally a test would permit accurate identification of those batteries which have degraded to a replacement threshold (typically about 80% of their nominal capacities) in a group of batteries which have capacities in excess of the replacement threshold.

Some investigators have suggested that improved accuracy in SoH measurements might be achieved by performing spectroscopy at low frequencies. However, the use of lower frequencies increases the time required to perform each test. The time taken for each test is at least several periods of the excitation waveform.

There is a need for rapid and accurate methods for determining the capacities of electrochemical storage batteries.

SUMMARY OF THE INVENTION

This invention relates to apparatus and methods for obtaining estimates of the SoH or other parameters of electrochemical batteries. One aspect of the invention provides a method for testing an electrochemical battery. The method comprises generating a response by applying an excitation waveform to an electrochemical battery being tested while maintaining a magnitude of the excitation waveform small enough that a relationship between the response and the excitation waveform is substantially linear. The method monitors the response and, based upon a value of the response during a period which does not exceed, and may be less than one cycle of the excitation waveform, determines a relationship between phase and amplitude of the excitation waveform and phase and amplitude of the response.

Methods according to some embodiments of the invention maintain the magnitude of the excitation waveform at less than a thermal voltage for each cell in the electrochemical battery. In some cases the magnitude of the excitation waveform is maintained at less than 15 mV per cell of the electrochemical battery. The excitation waveform may comprise a sinusoidal waveform.

In some embodiments the period does not exceed one half cycle of the excitation waveform. In such embodiments it is preferable that at least one zero crossing of the excitation waveform occurs during the period. In some embodiments a zero crossing of the excitation waveform occurs substantially half-way through the period.

The excitation waveform may have a frequency of 20 Hz or less.

Some embodiments of the invention involve determining a phase relationship between the excitation waveform and the response by a method which comprises performing the calculation:

$$\theta = \tan^{-1}\left[\frac{y_1 \sin\gamma}{y_2 - y_1 \cos\gamma}\right]$$

or a mathematical equivalent thereof. In this case, $\theta$ is a relative phase angle, $y_1$ is a magnitude of the response at a first time within the period, $y_2$ is the magnitude of the response at a second time within the period, $\gamma = 2\pi f t$, f is a frequency of the excitation waveform, and t is a time between the first and second times.

Methods according to some embodiments of the invention comprise determining an amplitude relationship between the excitation waveform and the response by performing the calculation:

$$A = \frac{y_1}{\sin\theta}$$

or a mathematical equivalent thereof, where A is a relative magnitude of the excitation waveform and the response.

Further aspects of the invention and features of specific embodiments of the invention are described below.

BRIEF DESCRIPTION OF THE DRAWINGS

In drawings which illustrate non-limiting embodiments of the invention.

DESCRIPTION

Throughout the following description, specific details are set forth in order to provide a more thorough understanding of the invention. However, the invention may be practiced without these particulars. In other instances, well known elements have not been shown or described in detail to avoid unnecessarily obscuring the invention. Accordingly, the specification and drawings are to be regarded in an illustrative, rather than a restrictive, sense.

Figure 1:
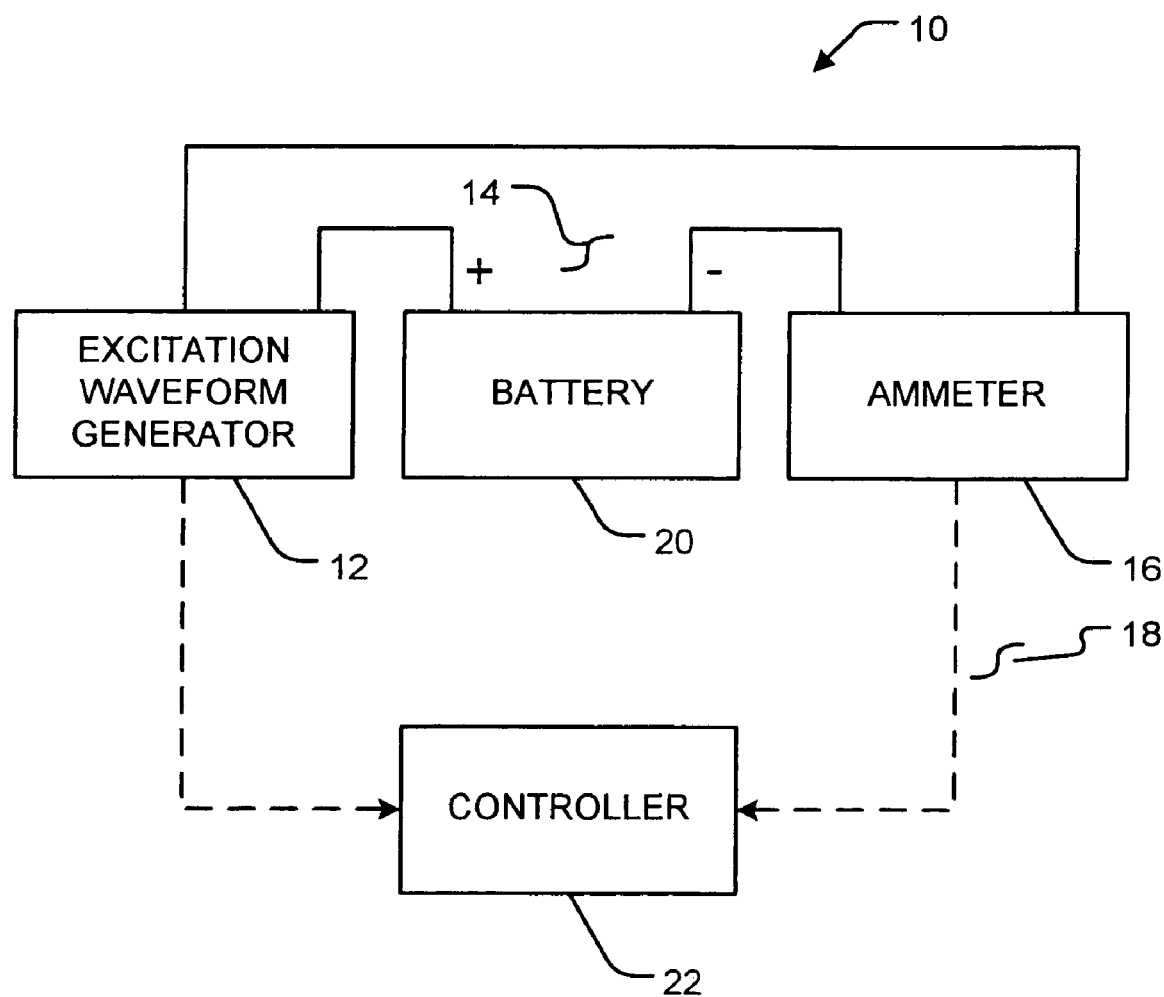
FIG. 1 is a block diagram of a battery testing system according to an embodiment of the invention.

This invention relates to testing electrochemical storage batteries. FIG. 1 is a block diagram of apparatus 10 for practising the invention. Apparatus 10 comprises an excitation waveform generator 12 connected to apply an excitation waveform 14 to a battery 20 being tested. An ammeter 16 measures current passing through battery 20 and provides a signal 18 indicative of the current to a controller 22. Controller 22 is connected to trigger the application of excitation waveform 14 to battery 20, receive the resulting signal 18, and to determine information about battery 20 from excitation waveform 14 and current signal 18.

Figure 2:
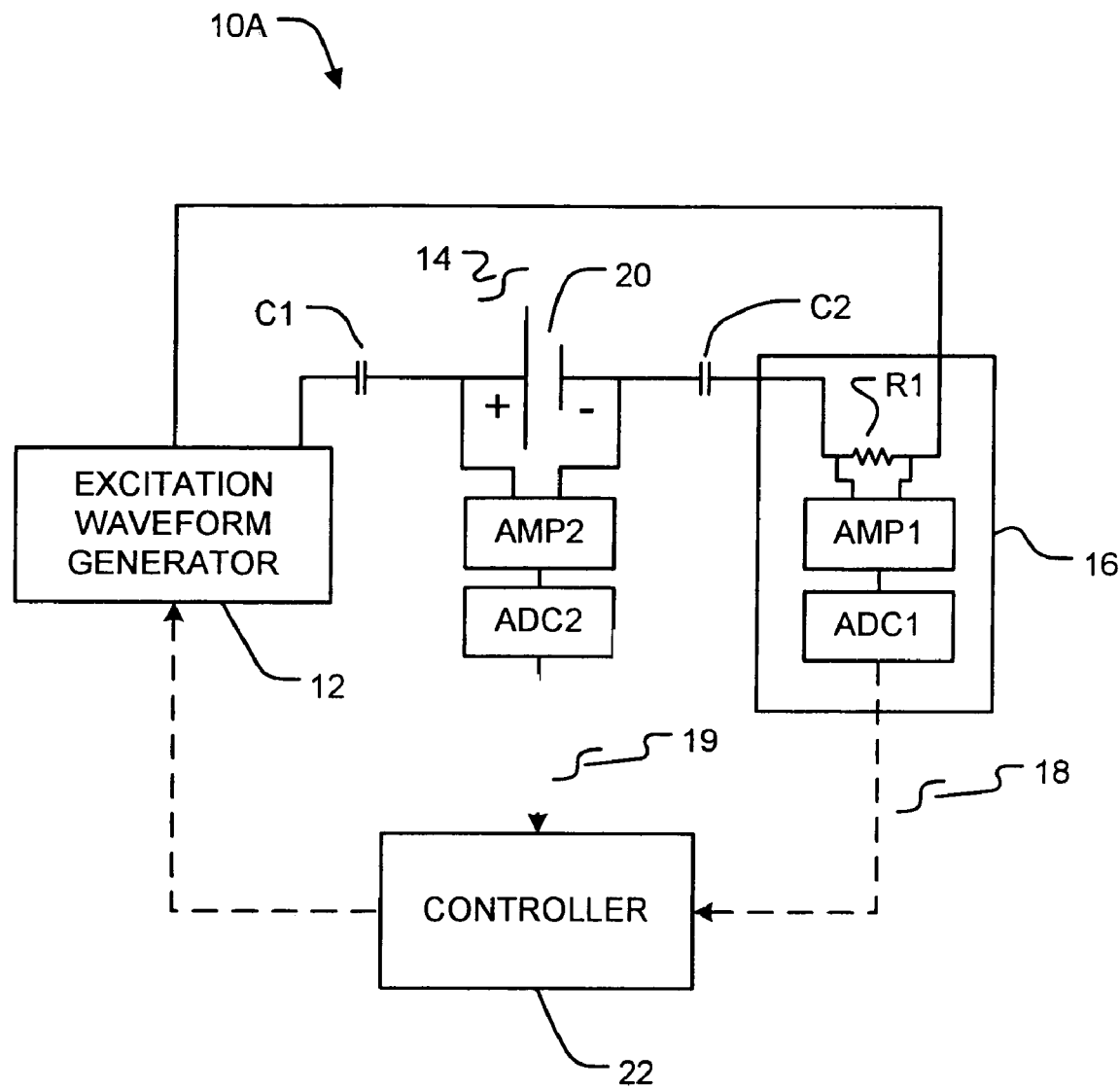
FIG. 2 is a block diagram of a battery testing system according to a more specific embodiment of the invention.

FIG. 2 is a block diagram of apparatus 10A according to a specific embodiment of the invention. In apparatus 10A, ammeter 16 comprises a resistor R1 connected in series with battery 20. An amplifier AMP1 amplifies and optionally performs other analog conditioning of the voltage across R1. Analog-to-digital converter ("ADC") ADC1 converts the output of amplifier AMP1 into a digital current signal 18 representative of the current flowing through battery 20. An amplifier AMP2 amplifies and optionally performs other analog conditioning of a voltage across battery 20. An ADC ADC2 converts the output from amplifier AMP2 into a digital voltage signal 19 representative of a voltage across battery 20 as a result of application of excitation signal 14. In this embodiment, signals 18 and 19 each consist of a series of sampled values. Capacitors C1 and C2 block direct current ("DC") components.

The inventors have determined that low frequency spectroscopy may be performed relatively rapidly by acquiring response data (e.g. measuring current) over a portion of a full cycle of an excitation waveform while maintaining an amplitude of the excitation waveform low enough that the response of the battery-under-test can expected to be related linearly to the excitation waveform.

Preferably the amplitude of the excitation waveform per cell at battery 20 is significantly lower than the thermal voltage $V_T$, which is given by:

$$V_T = kT/e \approx 25 \text{ mV} \qquad (3)$$

where k is Boltzmann's constant, T is temperature (room temperature is 298 K) and e is the electronic charge. For example, the amplitude of the excitation waveform may be made less than 15 mV/cell or preferably less than 10 mV/cell.

Figure 3:
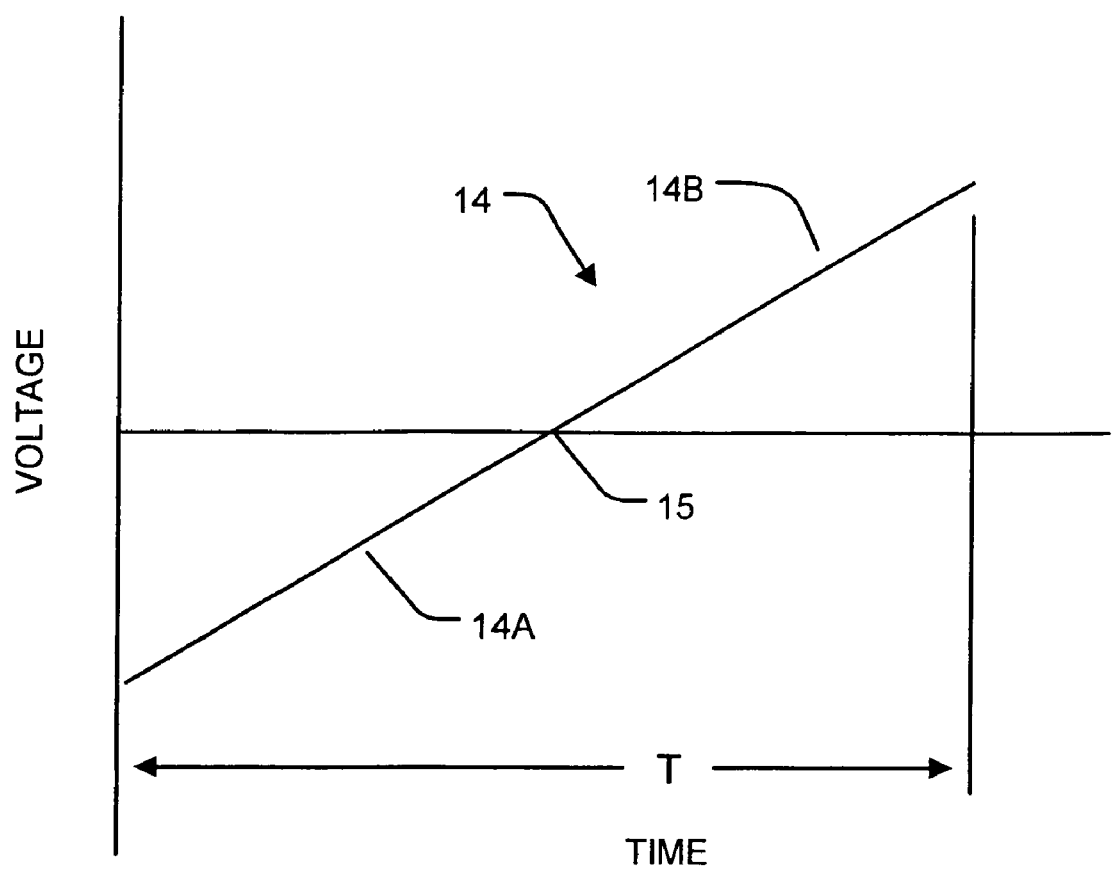
FIG. 3 is an example of an excitation waveform that could be used in the invention.

In some embodiments of the invention, excitation waveform 14 is a portion of a sine wave. As shown in FIG. 3, excitation waveform 14 may include a zero-crossing 15 such that a first part 14A of waveform 14 has a first polarity and a second part 14B of waveform 14 has a second polarity opposite to the first polarity. In some embodiments, the duration T of excitation waveform 14 is less than one full period of the sine wave on which excitation waveform 14 is based. If P is the period of the sine wave on which excitation waveform 14 is based then T may be, for example, ½P or less. In some embodiments of the invention, T is ¼P.

The fundamental frequency of excitation waveform 14 may be quite low. For example, the frequency may be less than 40 Hz. In some embodiments of the invention the fundamental frequency of excitation waveform is less than 35 Hz, less than 20 Hz, less than 5 Hz or less than 1 Hz.

Controller 22 may determine the complex impedance of battery 20 (or a function of the complex impedance) and use the complex impedance as a basis for evaluating the SoH of battery 20. To obtain the complex impedance of battery 20, controller 22 may determine the relative phases and amplitudes of signals 18 and 19.

As noted above, the methods of this invention require that the amplitude of excitation signal 14 be maintained at a value which is low enough that it can reasonably be assumed that response 18 is related linearly to excitation signal 14. This may be achieved by providing real time control of the voltage provided by excitation waveform generator 12. Where excitation waveform generator 12 comprises a sine wave generator having an output amplitude responsive to a control signal from controller 22 then a PID ("Proportional Integral Derivative") algorithm may be used to control waveform generator 12 so that the voltage of across battery 20 will have a desired value.

In an example embodiment of the invention, controller 22 runs software which monitors the amplitude of excitation signal 14 as indicated by signal 19 and determines an error e, which is a difference between the measured amplitude and a desired amplitude. The error is used to obtain a corrected value $V_{new}$ for the control signal which controls the amplitude of excitation waveform 14.

Controller 22 may, for example, implement a PID control algorithm given by:

$$V_{new} = Pe_n + PI\Delta t \sum_{j=1}^{j=n} e_j + PD\frac{\Delta e_n}{\Delta t} \qquad (4)$$

where P is the controller gain, I and D are suitably selected constants, $\Delta t$ is the sample time, and $\Delta e_n$ is the change in the error since the last iteration.

Figure 4:
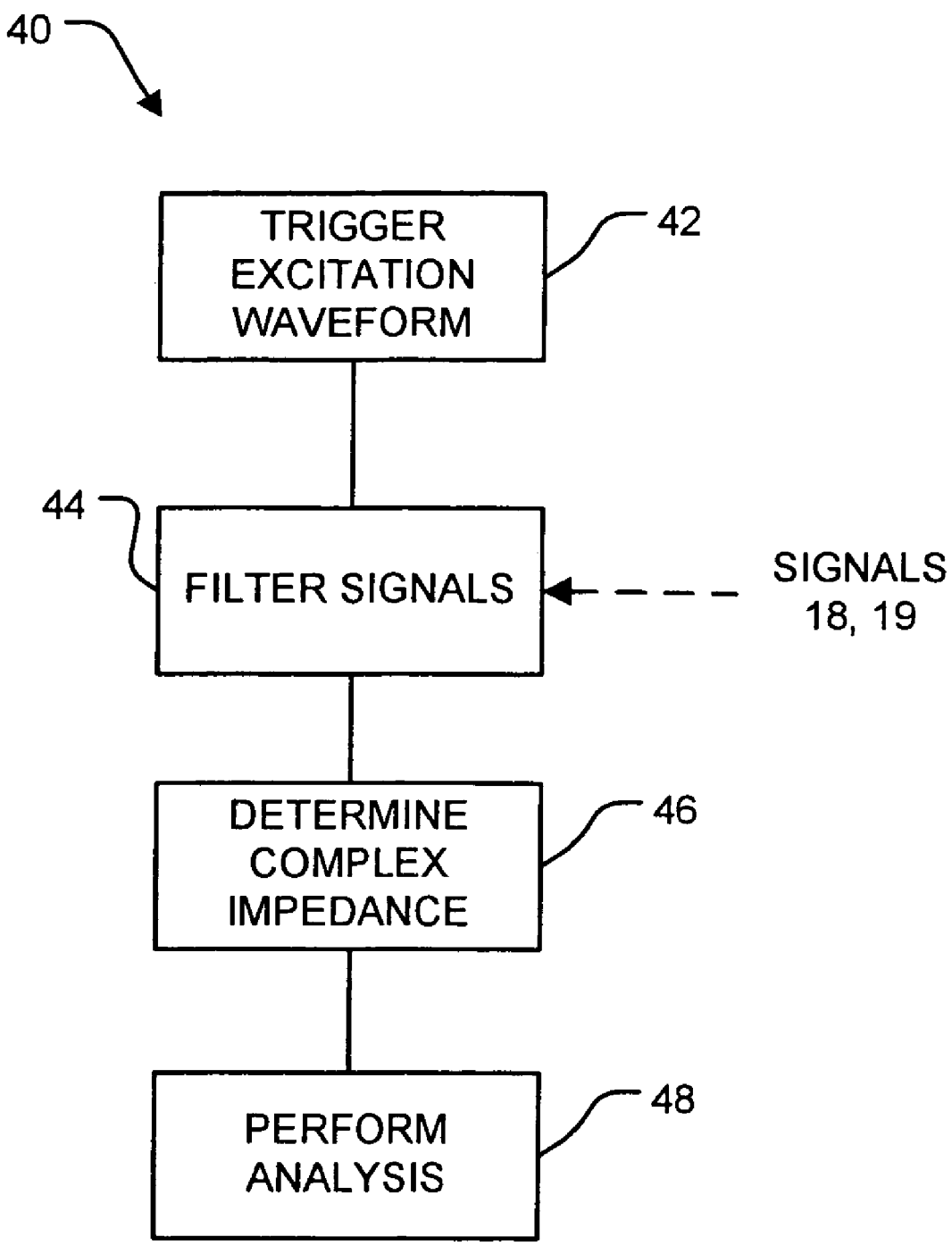
FIG. 4 is a flowchart illustrating a method according to the invention.

FIG. 4 is a flow chart of a process 40 that may be performed in controller 22 to obtain the relative phases and amplitudes of signals 18 and 19. In block 42, process 40 triggers the generation of excitation signal 14. Process 40 receives signals 18 and 19. In block 44, signals 18 and 19 are digitally filtered. In block 46, the complex impedance of battery 20 is determined. Block 48 performs analysis based upon the complex impedance.

It is necessary to remove any DC offset from signals 18 and 19. Since DC offset is frequency-independent and determining the DC offset is best done by monitoring over several cycles of an excitation signal, the DC offset may be measured by applying a higher frequency excitation signal (for example a signal of 500 Hz or more) and measuring the resulting DC offset in each of signals 18 and 19. The excitation signal is preferably a sinusoidal or other balanced waveform that has an average value of 0. The DC offset in each of signals 18 and 19 may be measured by determining the mean of signals 18 and 19 over a number of complete cycles of the excitation signal. The signals may be filtered so that accurate DC offset values may be obtained even if the signals are not averaged over an integral number of cycles.

Signals 18 and 19 may, for example, be filtered using a Hanning filter defined by:

$$y_i = 0.5 x_i \left[ 1 - \cos \frac{2\pi i}{n} \right] \quad (5)$$

where $y_i$ is the output of the filter for input sample $x_i$ and n is the number of samples. The mean values of the filtered signals 18 and 19 may be determined by computing:

$$DC = 2 \frac{\sum_i y_i}{n} \quad (6)$$

where DC is the DC offset of the signal. The applicable DC offset may be subtracted from each of signals 18 and 19.

Signals 18 and 19 are filtered to remove frequency components outside the region of interest. In example embodiments of the invention, signals 18 and 19 are filtered by high-order low-pass digital filters. The term "high-order" is used herein to mean an order of 40 or more. The filters may, for example, have the characteristics set out in Table I.

TABLE I

Example Filter Characteristics

| Type | Low-pass |
|---|---|
| Order | 100 |
| Sample Frequency | 2048 Hz |
| Stopband Frequency | 50 Hz |
| Passband Frequency | 35 Hz |
| Passband Deviation | 1 db |
| Stopband Deviation | 80 db |

Figure 5A:
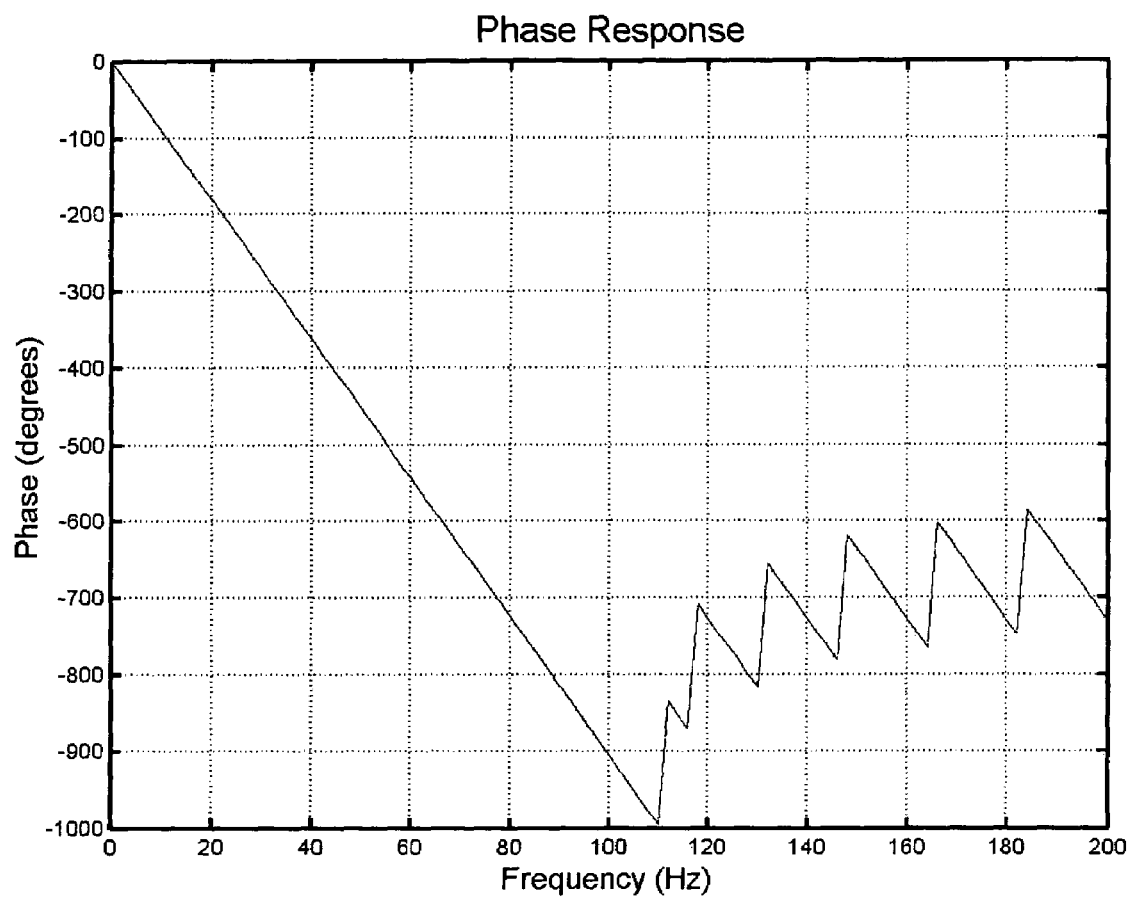
FIGS. 5A and 5B illustrate respectively phase response characteristics and impulse response characteristics of one type of filter that may be used in some embodiments of the invention.
Figure 5B:
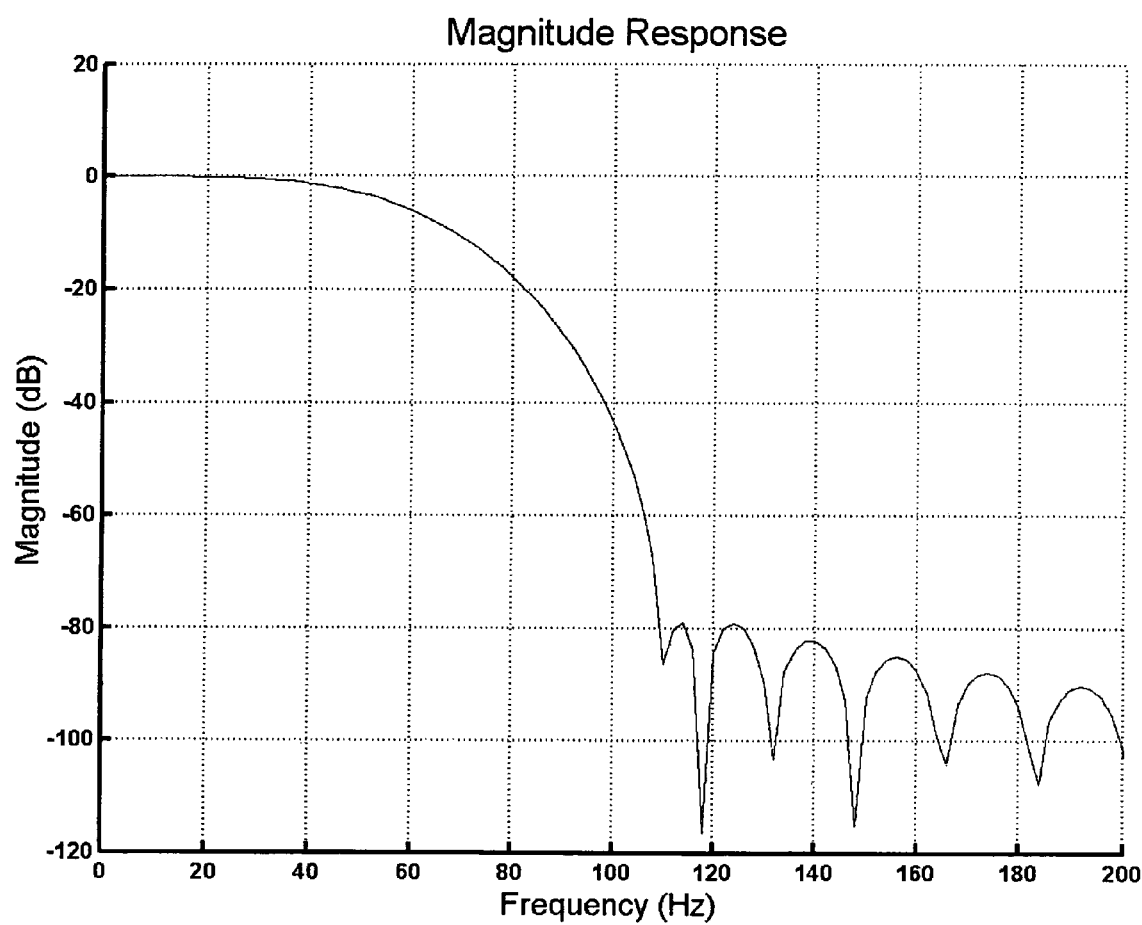
Figure 5C:
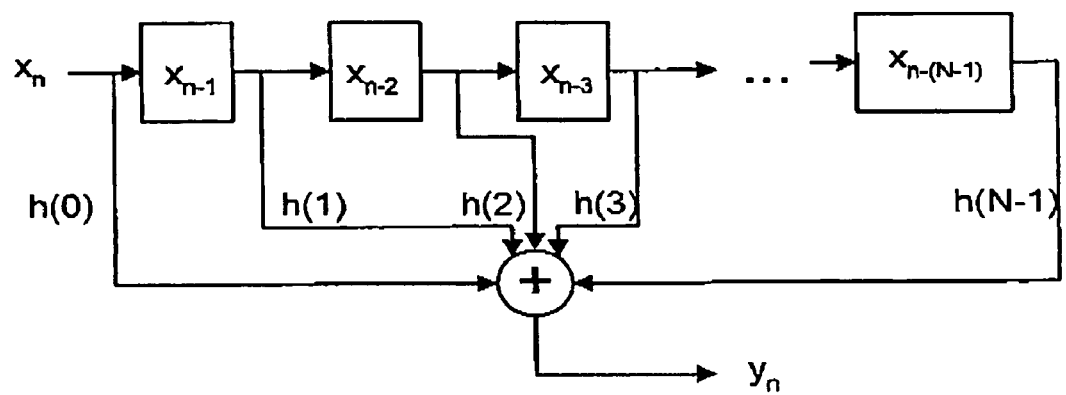
FIG. 5C illustrates one implementation of a digital filter used in some embodiments of the invention.

The digital filters used to filter signals 18 and 19 are preferably the same. The digital filters may be, for example, multipole finite impulse response ("FIR") filters or infinite impetus response ("IIR") filters. The digital filters could comprise low pass filters, bandpass filters or half band filters. FIG. 5A shows filter magnitude response characteristics of one example of a suitable filter. FIG. 5B shows filter phase response characteristics for the same filter. FIG. 5C shows a possible filter arrangement. The FIR filter illustrated in FIG. 5C implements the filter function:

$$y_n = \sum_{k=0}^{N-1} h(k) x_{n-k} \quad (7)$$

Any suitable filter may be used to remove frequencies which are not of interest. In embodiments where the filter is an FIR filter any suitable design of FIR filter may be used. A designer may apply any suitable design criteria to provide a filter having an order sufficiently high to remove noise from the signal without incurring a computational overhead too large for the available hardware. Sampling frequencies of ADC1 and ADC2 are selected to be high enough to obtain digital signals which can be filtered by the digital filters. For example, where the filters used to filter digital signals 18 and 19 are FIR filters then the sampling frequencies of ADC 1 and ADC 2 may be chosen to be at least 2×(fstop+fpass), where fstop is the stop band of the filter and fpass is the passband of the filter.

The relative phases and amplitudes of the filtered signals 18 and 19 may be determined by using geometric considerations to determine phases and amplitudes of each of signals 18 and 19 individually. Each of filtered signals 18 and 19 consists of a series of data points. Where excitation waveform 14 is a portion of a sinusoid and the response of battery 20 is linearly related to excitation waveform 14 then the data points of filtered signals 18 and 19 should fall on sinusoidal curves when plotted against time. These points may therefore be plotted onto a circle of some radius A, as shown in FIG. 6, where points separated by the same time differences are separated by equal angles.

A feature of such geometric methods is that values appropriate for use in impedance calculations may be obtained from response data corresponding to any portion of a cycle of the excitation waveform.

Figure 6:
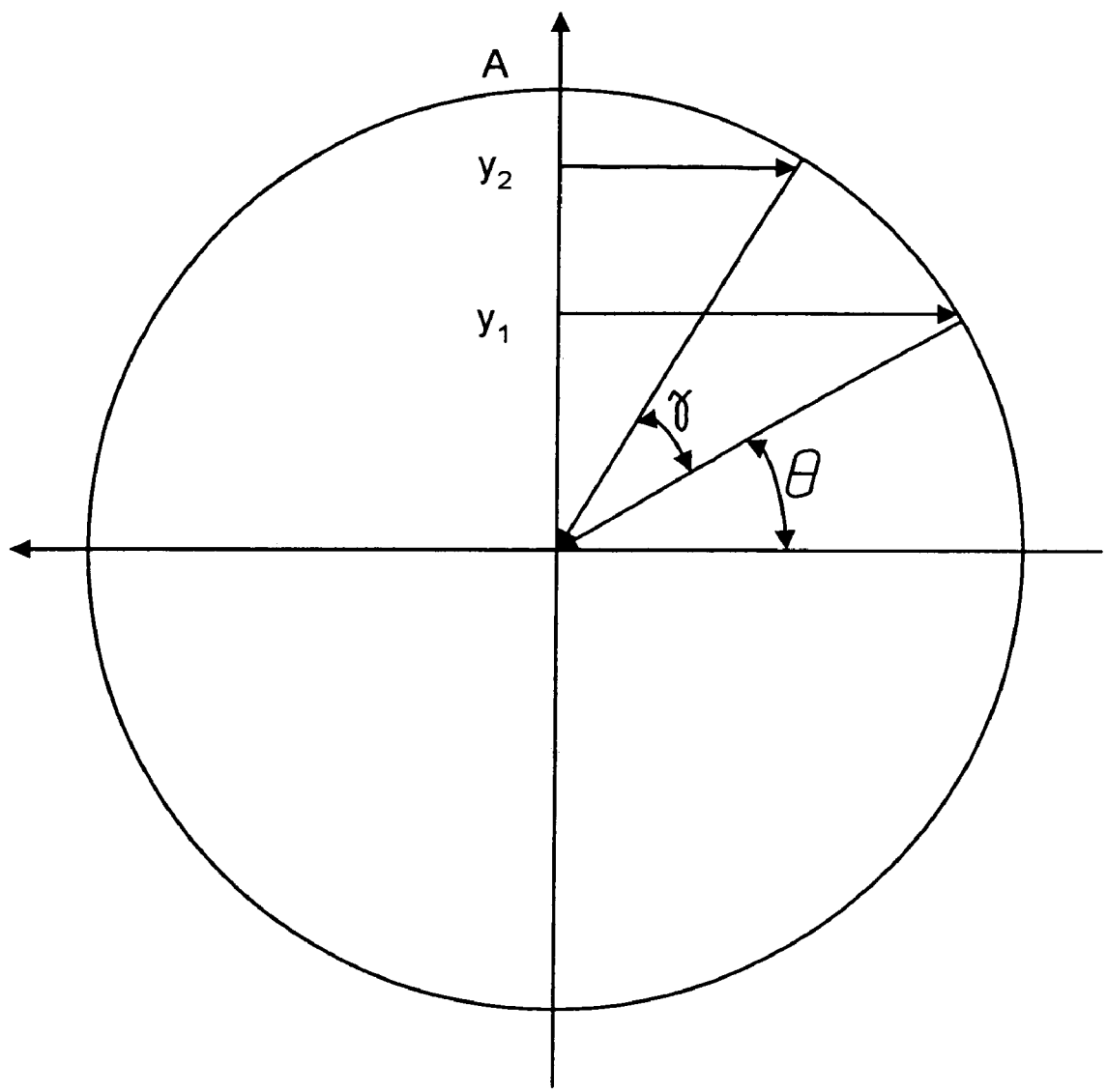
FIG. 6 is a diagram to accompany a description of a geometric method for determining phase and amplitude relationships of two signals.

FIG. 6 shows two points of one of signals 18 and 19 having values $y_1$ and $Y_2$ obtained at times separated by a phase angle $\gamma$. $\gamma$ is related to the time t between the measurements of $y_1$ and $y_2$ by:

$$\gamma = 2\pi f t \quad (8)$$

where f is the frequency of excitation waveform 14. It can be seen that the two points $y_1$ and $y_2$ may be described by:

$$y_1 = A \sin \theta \quad y_2 = A \sin(\theta + \gamma) \quad (9)$$

Since $y_1$, $y_2$ and $\gamma$ are known, one can solve for $\theta$ as follows:

$$\theta = \tan^{-1} \left[ \frac{y_1 \sin \gamma}{y_2 - y_1 \cos \gamma} \right] \quad (10)$$

One can then solve for A as follows:

$$A = \frac{y_1}{\sin\theta} \quad (11)$$

The calculations of Equations (7) and (8) may be applied to many pairs of points from the filtered signal 18 or 19 and the results averaged to provide values for A and θ. For example, more than 100 pairs of points may be considered. In some embodiments A and θ are determined by averaging results for on the order of 500 pairs of points.

The values for A and θ for signals 18 and 19 may be combined to yield the complex impedance of battery 20 or a function thereof. The complex impedance (or function thereof) may be used in evaluating the SoH of battery 20 in any suitable manner.

In some embodiments of the invention the complex impedance of battery 20 is determined for multiple frequencies of excitation waveform 14 and the results are used to compute a parameter related to the SoH of battery 20. For example, this invention may be used to obtain complex impedance information which may be used in the methods for determining battery SoH that are described in U.S. patent application Ser. No. 10/133,400 entitled MULTIPLE MODEL SYSTEMS AND METHODS FOR TESTING ELECTROCHEMICAL SYSTEMS which is hereby incorporated herein by reference.

In embodiments of the invention which include obtaining complex impedance information at multiple frequencies, the methods of this invention may be used to obtain measurements at two or more of the multiple frequencies. Where the multiple frequencies include higher frequencies, other methods may be used to obtain complex impedance information at the higher frequencies.

Other embodiments of the invention use modified fast fourier transform (FFT) technologies to measure phase and amplitude of the response waveform relative to the excitation waveform. FFT techniques generally require collecting data for multiple periods of the excitation waveform. In the FFT embodiments of this invention data is processed for less than 1½ cycles of the excitation waveform and preferably for not significantly more than one cycle of the excitation waveform.

In one FFT embodiment of the invention, data is collected for one cycle of the excitation waveform at high resolution (i.e. the sampling rate of ADC1 (and ADC2, when 2ADCs are used) is significantly higher than the frequency of the excitation waveform). The resulting data is compressed and replicated to yield a replicated signal which is used as an input to an FFT algorithm. The replicated signal may be windowed using any suitable windowing function as part of the FFT algorithm.

Figure 7:
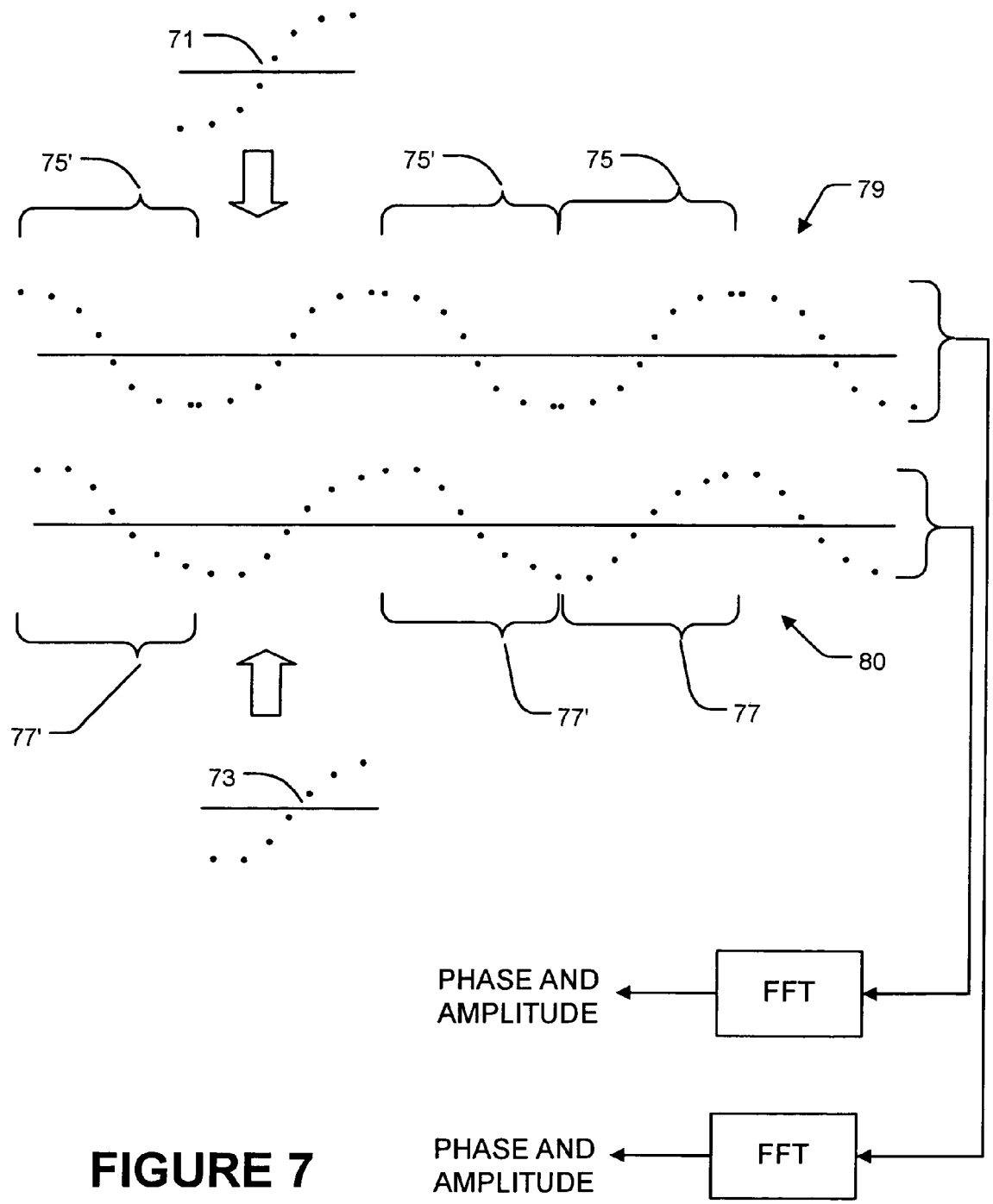
FIG. 7 is a diagram to accompany a description of a fourier transform method for determining phase and amplitude relationships of two signals.

In some embodiments of the invention the FFT is performed based on data collected over a fraction of a cycle of the excitation waveform. FIG. 7 shows an example of an embodiment for which excitation data 71 and response data 73 are collected during the period 70 which corresponds to ½ cycle of the excitation waveform. Excitation data 71 and response data 73 are replicated by providing inverted replicas 75' and 77' alternating with non-inverted replicas 75 and 77 to create multi-cycle signals 79 and 80 to be processed by an FFT algorithm to yield phases and amplitudes of the excitation and response waveforms.

Certain implementations of the invention comprise computer processors which execute software instructions which cause the processors to perform a method of the invention. For example, one or more processors in a computer may implement the methods of FIG. 4 or 7 by executing software instructions in a program memory accessible to the processors. The processors may compress embedded processors, digital signal processors, stand alone data processors or the like. The invention may also be provided in the form of a program product. The program product may comprise any medium which carries a set of computer-readable signals comprising instructions which, when executed by a computer processor, cause the data processor to execute a method of the invention. Program products according to the invention may be in any of a wide variety of forms. The program product may comprise, for example, physical media such as magnetic data storage media including floppy diskettes, hard disk drives, optical data storage media including CD ROMs, DVDs, electronic data storage media including ROMs, flash RAM, or the like or transmission-type media such as digital or analog communication links.

Where a component (e.g. a software module, processor, assembly, device, circuit, etc.) is referred to above, unless otherwise indicated, reference to that component (including a reference to a "means") should be interpreted as including as equivalents of that component any component which performs the function of the described component (i.e., that is functionally equivalent), including components which are not structurally equivalent to the disclosed structure which performs the function in the illustrated exemplary embodiments of the invention.

As will be apparent to those skilled in the art in the light of the foregoing disclosure, many alterations and modifications are possible in the practice of this invention without departing from the spirit or scope thereof.

Accordingly, the scope of the invention is to be construed in accordance with the substance defined by the following claims.

What is claimed is:

1. A method for testing an electrochemical battery, the method comprising:
    generating a response by applying an excitation waveform to an electrochemical battery being tested while maintaining a magnitude of the excitation waveform small enough that a relationship between the response and the excitation waveform is substantially linear;
    monitoring the response;
    based upon values of the response during a period which does not exceed one cycle of the excitation waveform, determining a relationship between phase and amplitude of the excitation waveform and phase and amplitude of the response.

2. A method according to claim 1 comprising maintaining the magnitude of the excitation waveform at less than a thermal voltage for each cell in the electrochemical battery.

3. A method according to claim 1 comprising maintaining the magnitude of the excitation waveform at less than 15 mV per cell of the electrochemical battery.

4. A method according to claim 1 comprising maintaining the magnitude of the excitation waveform at less than 10 mV per cell of the electrochemical battery.

5. A method according to claim 1 wherein the excitation waveform comprises a sinusoidal waveform.

6. A method according to claim 1 wherein the period does not exceed one half cycle of the excitation waveform.

7. A method according to claim 6 wherein the period includes one zero crossing of the excitation waveform.

8. A method according to claim 7 wherein the zero crossing of the excitation waveform occurs substantially half-way through the period.

9. A method according to claim 1 wherein the excitation waveform has a frequency not exceeding 20 Hz.

10. A method according to claim 1 wherein the excitation waveform has a frequency not exceeding 5 Hz.

11. A method according to claim 1 wherein the response is an electrical current.

12. A method for testing an electrochemical battery, the method comprising:

generating a response by applying an excitation waveform to an electrochemical battery being tested while maintaining a magnitude of the excitation waveform small enough that a relationship between the response and the excitation waveform is substantially linear;

monitoring the response;

based upon values of the response during a period which does not exceed one cycle of the excitation waveform, determining a relationship between phase and amplitude of the excitation waveform and phase and amplitude of the response wherein determining a phase relationship between the excitation waveform and the response comprises performing the calculation:

$$\theta = \tan^{-1}\left[\frac{y_1 \sin\gamma}{y_2 - y_1 \cos\gamma}\right]$$

or a mathematical equivalent thereof, wherein $\theta$ is a relative phase angle, $y_1$ is a magnitude of the response at a first time within the period, $y_2$ is the magnitude of the response at a second time within the period, $\gamma=2\pi ft$, if is a frequency of the excitation waveform, t is a time between the first and second times.

13. A method according to claim 12 comprising computing the relative phase for a plurality of pairs of first and second times to obtain a plurality of computed relative phases and combining the plurality of computed relative phases to provide an estimate of the relative phases of the excitation waveform and response.

14. A method according to claim 13 wherein combining the combining the plurality of computed relative phases comprises determining an average of the plurality of computed relative phases.

15. A method according to claim 13 comprising computing the relative phase for at least 100 pairs of first and second times within the period.

16. A method according to claim 12 comprising determining an amplitude relationship between the excitation waveform and the response by performing the calculation:

$$A = \frac{y_1}{\sin\theta}$$

or a mathematical equivalent thereof, where A is a relative magnitude of the excitation waveform and the response.

17. A method according to claim 16 comprising computing the relative amplitude for a plurality of pairs of first and second times to obtain a plurality of computed relative amplitudes and combining the plurality of computed relative amplitudes to provide an estimate of the relative amplitudes of the excitation waveform and response.

18. A method according to claim 17 wherein combining the plurality of computed relative amplitudes comprises determining an average of the plurality of computed relative amplitudes.

19. A method according to claim 17 comprising computing the relative amplitude for at least 100 pairs of first and second times within the period.

20. A method according to claim 1 wherein determining the relationship between the phase and amplitude of the excitation waveform and the phase and amplitude of the response comprises replicating the values of the response during the period to yield a multi-cycle waveform and performing a Fourier transformation on the multi-cycle waveform.

21. A method according to claim 20 wherein the period is equal to ½ cycle of the excitation waveform and replicating the values comprises inverting the values and not inverting the values in alternation to yield the multi-cycle waveform.

* * * * *